US009741603B2

(12) United States Patent
Tobisaka et al.

(10) Patent No.: US 9,741,603 B2
(45) Date of Patent: Aug. 22, 2017

(54) METHOD FOR PRODUCING HYBRID SUBSTRATE, AND HYBRID SUBSTRATE

(71) Applicant: Shin-Etsu Chemical Co., Ltd., Tokyo (JP)

(72) Inventors: Yuji Tobisaka, Annaka (JP); Shoji Akiyama, Annaka (JP); Yoshihiro Kubota, Annaka (JP); Makoto Kawai, Annaka (JP); Kazutoshi Nagata, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/785,724

(22) PCT Filed: Apr. 21, 2014

(86) PCT No.: PCT/JP2014/061807
§ 371 (c)(1),
(2) Date: Oct. 20, 2015

(87) PCT Pub. No.: WO2014/178356
PCT Pub. Date: Nov. 6, 2014

(65) Prior Publication Data
US 2016/0071761 A1    Mar. 10, 2016

(30) Foreign Application Priority Data
May 1, 2013 (JP) .................... 2013-096512

(51) Int. Cl.
*H01L 21/762* (2006.01)
*H01L 21/02* (2006.01)
(Continued)

(52) U.S. Cl.
CPC .. *H01L 21/76256* (2013.01); *H01L 21/02164* (2013.01); *H01L 21/304* (2013.01);
(Continued)

(58) Field of Classification Search
CPC ............... H01L 21/76251; H01L 21/86; H01L 21/76256
See application file for complete search history.

(56) References Cited

U.S. PATENT DOCUMENTS 5,453,394 A * 9/1995 Yonehara .......... H01L 21/30604
148/DIG. 12
5,478,408 A * 12/1995 Mitani ................. H01L 21/3225
148/33.3
(Continued)

FOREIGN PATENT DOCUMENTS

JP    2004-513517 A    4/2004
JP    2010-278339 A    12/2010
(Continued)

OTHER PUBLICATIONS

Sanz-Velasco et al., "Room Temperature Wafer Bonding Using Oxygen PlasmaTreatment in Reactive Ion Etchers With and without Inductively Coupled Plasma", Journal of the Electrochemical Soc., 150 (2) G155-G156 (2003).*
(Continued)

*Primary Examiner* — Tom Thomas
*Assistant Examiner* — Vincent Wall
(74) *Attorney, Agent, or Firm* — Westerman, Hattori, Daniels & Adrian, LLP (57) ABSTRACT

A hybrid substrate has an SOI structure having a good silicon active layer, without defects such as partial separation of the silicon active layer is obtained without trimming the outer periphery of the substrate. An SOI substrate is obtained by sequentially laminating a first silicon oxide film and a silicon active layer in this order on a silicon substrate. A terrace portion that does not have the silicon active layer is formed in the outer peripheral portion of the silicon substrate surface. A second silicon oxide film is formed on the silicon active layer surface of the SOI substrate The
(Continued)

bonding surfaces of the SOI substrate and a supporting substrate that has a thermal expansion coefficient different from that of the SOI substrate is subjected to an activation treatment. The SOI substrate and the supporting substrate are bonded with the second silicon oxide film being interposed therebetween.

9 Claims, 2 Drawing Sheets (51) Int. Cl.
H01L 21/304 (2006.01)
H01L 21/306 (2006.01)
H01L 21/311 (2006.01)
H01L 27/12 (2006.01)
H01L 29/06 (2006.01)

(52) U.S. Cl.
CPC .. *H01L 21/30604* (2013.01); *H01L 21/31111* (2013.01); *H01L 27/1207* (2013.01); *H01L 29/0649* (2013.01)

(56) References Cited

U.S. PATENT DOCUMENTS

| 6,417,108 | B1* | 7/2002 | Akino | H01L 21/2007 156/150 |
| 6,627,519 | B2* | 9/2003 | Kwon | H01L 21/76254 257/E21.568 |
| 7,084,046 | B2* | 8/2006 | Mitani | H01L 21/76254 257/E21.568 |
| 8,505,197 | B2 | 8/2013 | Blanchard | |
| 2004/0014299 | A1 | 1/2004 | Moriceau et al. | |
| 2006/0121696 | A1* | 6/2006 | Shiota | H01L 21/3226 438/459 |
| 2011/0097874 | A1* | 4/2011 | Broekaart | H01L 21/304 438/459 |
| 2011/0151644 | A1* | 6/2011 | Vaufredaz | H01L 21/76256 438/459 |
| 2011/0230005 | A1 | 9/2011 | Vaufredaz et al. | |
| 2012/0015497 | A1* | 1/2012 | Gaudin | H01L 21/187 438/455 |
| 2013/0273714 | A1* | 10/2013 | Wei | H01L 21/76254 438/458 |
| 2014/0235032 | A1* | 8/2014 | Akiyama | H01L 21/76251 438/458 |
| 2014/0322546 | A1 | 10/2014 | Akiyama et al. | |
| 2015/0179506 | A1* | 6/2015 | Konishi | H01L 21/76254 257/507 |

FOREIGN PATENT DOCUMENTS

| JP | 2011-71487 A | 4/2011 |
| JP | 2011-181919 A | 9/2011 |
| JP | 2012-509581 A | 4/2012 |
| WO | 2013/058292 A1 | 4/2013 |
| WO | 2013/105634 A1 | 7/2013 |

OTHER PUBLICATIONS

Yim, et al., "Thermal expansion of AlN, sapphire, and silicon", 45, 1456 (1974).*
International Search Report dated Aug. 12, 2014, issued in counterpart application No. PCT/JP2014/061807 (2 pages).

* cited by examiner

METHOD FOR PRODUCING HYBRID SUBSTRATE, AND HYBRID SUBSTRATE

TECHNICAL FIELD

This invention relates to a method for producing a hybrid substrate of silicon-on-insulator (SOI) structure, and a hybrid substrate.

BACKGROUND ART

The "hydrogen ion implantation method" utilizing hydrogen ion implantation is known as one of methods for preparing bonded-silicon on sapphire (B-SOS). Known is a method involving bonding a hydrogen ion-implanted silicon substrate which has been surface activated to a sapphire substrate by the bonding technique, and causing mechanical separation at the hydrogen ion-implanted interface using a suitable mechanical means such as driving in a wedge, injecting a water jet, or irradiating light to the interface, yielding a thinned silicon film.

As another approach, a method for preparing a support substrate having SOI structure, by bonding a SOI substrate including a silicon substrate as base substrate to a support substrate, grinding and etching the SOI substrate to remove the silicon substrate thereof was proposed. Development efforts are currently continued.

In this case, it is important to what extent the silicon substrate is ground or how to trim an outer peripheral portion of bonded substrate. In JP-A 2011-071487 (Patent Document 1), for example, the trimming technique is the key. As the timing of trimming, after a bonded wafer is ground, a periphery thereof is trimmed, and after trimming, both the peripheral portion and an active portion are treated by chemical etching. As opposed to the prior art where trimming precedes grinding for thinning, better results are allegedly obtained when grinding for thinning is followed by trimming.

Also, there are function-enhanced substrates including silicon-on-quartz (SOQ) which is utilized in optoelectronic applications due to high transparency, and silicon-on-sapphire (SOS) which is utilized in high-frequency applications due to tight insulation and good heat conduction. It is known that since these composite or hybrid substrates are obtained from a combination of silicon serving as a semiconductor layer with a material having a different coefficient of thermal expansion, their manufacture is difficult, when they are manufactured by bonding, because of the difference in coefficient of thermal expansion between two substrates.

The known methods for manufacturing SOI type hybrid substrates by bonding include the following.

(1) One method is a so-called "smart cut" method involving implanting hydrogen ions into a silicon wafer having an oxide film formed as by thermal oxidation, bonding the wafer to a support substrate, effecting consolidation heat treatment, and applying heat for thermal separation. The method is such that heat treatment at high temperature causes the implanted gas to form a microbubble layer in the bulk of substrate whereupon separation occurs by expansion of the bubble layer. High-temperature heat treatment is thus essential, making it difficult to apply the method to substrates having different coefficients of thermal expansion.

(2) Another method is a SiGen method involving implanting hydrogen ions into a silicon wafer having an oxide film formed as by thermal oxidation, bonding the wafer to a support substrate, effecting consolidation heat treatment, and effecting mechanical separation. This method does not need the action of collection and expansion of the bubble layer in the bulk, high-temperature heat treatment is unnecessary, and the bond strength is previously increased by activating the bonding interface with plasma or the like, allowing heat treatment at lower temperature. The stack is not exposed to high temperature as in the smart cut method. However, mechanical separation cannot avoid that stresses are locally applied to a portion of the bonded substrate, with the drawback that the silicon thin film in that portion is prone to be defective. If the temperature of heat treatment is elevated to increase the bond strength for preventing the drawback, the problem of coefficient of thermal expansion arises like the smart cut method. Notably, the portion where stresses are locally applied includes a periphery where the bonding interface in bonded substrate breaks off and the terminus of separation, the circumference of silicon thin film becomes irregular or includes fine pits (microscopic film thickness variations).

While the above two methods rely on the ion implantation/peeling procedure of implanting hydrogen ions and effecting separation (or exfoliation) at the defective layer caused by hydrogen ions, problems may arise including defects spreading from the defective layer and more defects resulting from diffusion of hydrogen gas species. In particular, high-temperature treatment such as thermal oxidation treatment can generate defects.

(3) In contrast to the above, the method not resorting to the ion implantation/peeling procedure is a method involving bonding a silicon wafer having an oxide film formed by thermal oxidation to a support substrate, effecting consolidation heat treatment, grinding or etching the back surface of the silicon substrate for thinning the silicon substrate, thereby finishing a silicon thin film of the desired thickness. When the thickness of the finished silicon thin film is thin, the amount of material removed (working amount) is increased. Thus this method fails to reduce the variation of in-plane thickness. Studies are made on the technique of increasing accuracy by implanting oxygen ions to form a stop layer against grinding or etching. This method suffers from the problem of film thickness distribution and the problem that a peripheral portion is not neat since an unbonded portion at the periphery can be chipped away during the grinding step or left behind. Sometimes the step of trimming the periphery prior to or during the grinding step must be added, making the method cumbersome.

PRIOR ART DOCUMENT

Patent Document

Patent Document 1: JP-A 2011-071487

SUMMARY OF THE INVENTION

Problems to be Solved by the Invention

An object of the invention, which has been made under the above circumstances, is to provide a method for producing a hybrid substrate of SOI structure having a silicon active layer of quality, by bonding a SOI substrate to a support substrate, typically sapphire substrate, having a different coefficient of thermal expansion from the SOI substrate, which method excludes the influence of damages by hydrogen ion implantation and eliminates drawbacks such as partial delamination of silicon active layer at the periphery of the substrate without a need for trimming of the substrate periphery; and a hybrid substrate.

Means for Solving the Problems

The above object is attained by the invention that provides a method for producing a hybrid substrate, and a hybrid substrate, as defined below.

[1] A method for producing a hybrid substrate comprising the steps of:

furnishing an SOI substrate which is obtained by stacking a first silicon oxide layer and a silicon active layer in this order on a silicon substrate such that a terrace portion not including the silicon active layer is left on an outer peripheral portion of the silicon substrate surface, forming a second silicon oxide layer on the silicon active layer surface of the SOI substrate, prior to bonding the SOI substrate to a support substrate having a different coefficient of thermal expansion from the SOI substrate, subjecting the surface of the SOI substrate and/or the support substrate to be bonded to activation treatment, bonding the SOI substrate to the support substrate at a higher temperature than room temperature, with the second silicon oxide layer interposed therebetween, to form a bonded substrate, subjecting the bonded substrate to a combination of a consolidation heat treatment for increasing the bond strength between the SOI substrate and the support substrate and a grinding/thinning treatment of thinning the silicon substrate by grinding, the combination being repeated at least twice under the conditions that the temperature of the first consolidation heat treatment is equal to or higher than the bonding temperature, the silicon substrate after the first grinding/thinning treatment has a thickness of 130 μm at the thinnest, the temperature of the final consolidation heat treatment is 200° C. to less than 250° C., the silicon substrate after the final grinding/thinning treatment has a thickness of 60 μm at the thinnest, etching away the thinned silicon substrate until the first silicon oxide layer is exposed, and etching away the bare first silicon oxide film, yielding a hybrid substrate in which the silicon active layer is disposed on the support substrate via the silicon oxide layer.

[2] The method for producing a hybrid substrate of [1] wherein the bonding temperature at which the SOI substrate is bonded to the support substrate is in a range from 100° C. to less than 250° C.

[3] The method for producing a hybrid substrate of [1] or [2] wherein the consolidation heat treatment for increasing the bond strength between the SOI substrate and the support substrate is at a temperature which is higher than the bonding temperature by 0 to 100° C. and which is lower than 250° C.

[4] The method for producing a hybrid substrate of any one of [1] to [3] wherein the temperature of second or subsequent consolidation heat treatment is higher than the temperature of the preceding consolidation heat treatment.

[5] The method for producing a hybrid substrate of any one of [1] to [3] wherein when the temperature of the first consolidation heat treatment is from 200° C. to less than 250° C., the second and subsequent consolidation heat treatments are omitted.

[6] The method for producing a hybrid substrate of any one of [1] to [5] wherein the silicon substrate after the first grinding/thinning treatment has a thickness of 130 μm to 200 μm.

[7] The method for producing a hybrid substrate of any one of [1] to [6] wherein the silicon substrate after the final grinding/thinning treatment has a thickness of 60 μm to 100 μm.

[8] The method for producing a hybrid substrate of any one of [1] to [7] wherein the terrace portion has a width of 1 mm to 3 mm.

[9] The method for producing a hybrid substrate of any one of [1] to [8] wherein the silicon active layer in the SOI substrate is free of vacancy defects and suffers no oxidation-induced stacking faults upon thermal oxidation.

[10] The method for producing a hybrid substrate of any one of [1] to [9] wherein the support substrate is made of quartz glass, borosilicate glass or sapphire.

[11] The method for producing a hybrid substrate of any one of [1] to [10], further comprising the step of subjecting the support substrate to heat treatment in a reducing atmosphere, prior to the step of bonding the SOI substrate to the support substrate.

[12] The method for producing a hybrid substrate of any one of [1] to [11] wherein the support substrate is thinned such that the surface of the support substrate to be bonded to the SOI substrate includes an outer peripheral region of predetermined width which is depressed relative to a central portion.

[13] A hybrid substrate produced by the method of any one of [1] to [12], having the silicon active layer disposed on the support substrate via the silicon oxide layer.

Advantageous Effects of the Invention

According to the invention, even when substrates having different coefficients of thermal expansion are bonded together, the bond strength between the SOI substrate and the support substrate can be increased by raising the heat treatment temperature by an increment sufficient for the substrates to be bonded by heating at a predetermined temperature. The silicon substrate can be thinned by grinding under ingeniously selected grinding conditions, while preventing drawbacks such as separation of silicon active layer at the substrate periphery. This eliminates the step of trimming the substrate periphery as adopted in the prior art. While the first silicon oxide layer in the SOI substrate serves as an etch stop layer, the thickness of the silicon active layer is precision controllable.

BRIEF DESCRIPTION OF THE DIAGRAMS

EMBODIMENT FOR CARRYING OUT THE INVENTION

Now embodiments of the method for producing a hybrid substrate according to the invention are described.

Figure 1:
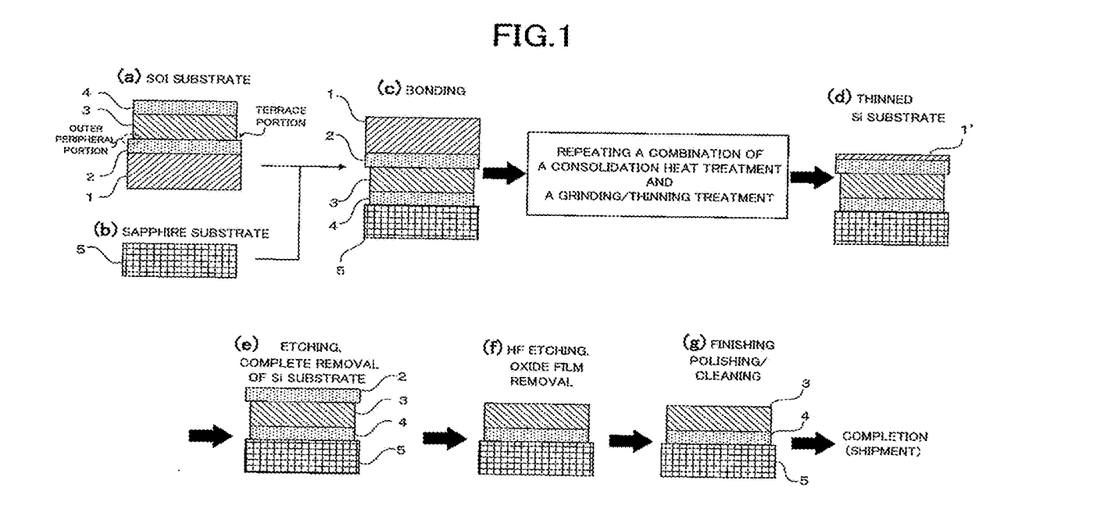
FIG. 1 is a schematic view showing one embodiment of the method for producing a hybrid substrate according to the invention; (a) being a cross-sectional view of SOI substrate; (b) being a cross-sectional view of support substrate (sapphire substrate); (c) being a cross-sectional view of SOI substrate and support substrate after bonding and consolidation heat treatment; (d) being a cross-sectional view of silicon substrate as ground; (e) being a cross-sectional view of the remaining silicon substrate as etched away; (f) being a cross-sectional view of the first oxide layer as etched away; and (g) being a cross-sectional view of substrate after finish polishing and cleaning.

Referring to FIG. 1, the method for producing a hybrid substrate according to the invention involves, in sequence, the step (Step 1) of furnishing SOI substrate, the step (Step 2) of furnishing support substrate, the step (Step 3) of surface activation treatment on SOI substrate and/or support substrate, the step (Step 4) of bonding SOI substrate to support substrate, the step (Step 5) of consolidation heat treatment, the step (Step 6) of thinning silicon substrate by grinding, the step (Step 7) of removing thinned silicon substrate, and the step (Step 8) of removing first silicon oxide layer.

(Step 1: Step of Furnishing SOI Substrate)

There is furnished a SOI substrate which is constructed by stacking a first silicon oxide layer 2 and a silicon active layer 3 in this order on a silicon substrate 1. Stacking is preferably such that a terrace portion not including the silicon active layer 3 is left on an outer peripheral portion (or periphery) of the silicon substrate 1 surface.

Though not particularly limited, the silicon substrate 1 used herein may be, for example, a substrate obtained by slicing a monocrystalline boule grown by the Czochralski (CZ) process, typically having a diameter of 100 to 300 mm, P or N conductivity type, and a resistivity of about 10 Ω·cm. It is preferred from a balance of ease of handling and a time required in the grinding/thinning treatment (to be described later) that the silicon substrate 1 have a thickness of 450 to 775 μm, more preferably 500 to 600 μm.

As described herein, the numerical range of XXX to YYY refers to a range with the upper and lower limits being inclusive. For example, a range of 100 to 300 mm means a range from 100 mm to 300 mm.

The first silicon oxide layer 2 is a silicon dioxide ($SiO_2$) insulating film known as buried oxide (BOX) layer and serves as an etch stop layer in the final step. The thickness of first silicon oxide layer 2 may be determined from the thickness of Si to be etched away (i.e., thickness of thinned silicon substrate) and a selective etching ratio between Si and $SiO_2$ by etchant and specifically, computed from a selective etching ratio and set as including an allowance for in-plane thickness variations and etching variations. For example, when the thickness of Si to be etched away is about 80 μm, the first silicon oxide layer 2 has a thickness of preferably at least 300 nm, more preferably 300 to 500 nm.

Preferably the silicon active layer 3 is free of defects of vacancy type or crystal originated particles (COP) and avoids the generation of oxidation-induced stacking faults (OSF) upon thermal oxidation. The silicon active layer 3 is a thin film of monocrystalline silicon and eventually becomes a SOI layer (semiconductor layer) on the support substrate.

For example, the silicon active layer 3 preferably has a thickness of 100 to 500 nm, more preferably 100 to 300 nm.

The aforementioned SOI substrate is preferably one obtained by the ion implantation/peeling method. In this embodiment, it is a silicon thin film surface layer after separation, from which a crystal defective layer damaged by ion implantation is removed by wet or dry etching. Specifically, a silicon substrate 1 having a first silicon oxide layer 2 formed thereon is bonded to another silicon substrate having an ion implanted region formed at a predetermined depth by ion implantation before the other silicon substrate is separated along the ion implanted region, yielding the aforementioned SOI substrate.

Notably, it is preferred that a region of roll off (or polishing sag in wafer CMP step during manufacture of silicon substrate) of the silicon substrate 1 be a terrace portion. In the aforementioned ion implantation/peeling method, when the silicon substrate 1 having a first silicon oxide layer 2 formed thereon is bonded to the other silicon substrate having an ion implanted region formed therein, they are not contacted with each other at the terrace portion, and therefore, a silicon thin film (to become the silicon active layer 3) is not transferred to this region of silicon substrate 1, that is, silicon active layer 3 is excluded in the region. The edge roll off of the silicon substrate 1 may be adjusted such that the terrace portion is formed in a region having a width of preferably 1 to 3 mm, more preferably 2 to 3 mm from the edge (outer periphery) of the silicon substrate. Then, in the terrace portion of the SOI substrate (a region having a width of 1 to 3 mm from the outer periphery of the bonded substrates), the SOI substrate and the support substrate are not contacted with each other in the bonding stage, and the silicon active layer 3 is absent. This prevents the silicon active layer 3 from being locally peeled at the later stage of thinning the silicon substrate by grinding. It is noted that if the terrace portion has a width of less than 1 mm, there is a risk that even after the SOI substrate and the support substrate are bonded together and subjected to consolidation heat treatment, the silicon active layer can be peeled in part because local stresses are applied to the substrate periphery at the stage of thinning the silicon substrate by grinding. If the terrace portion has a width of more than 3 mm, undesirably the area of silicon active layer is reduced.

It is noted that where the terrace portion is not provided, the support substrate to be bonded to the SOI substrate is thinned such that the surface of the support substrate to be bonded includes an outer peripheral region corresponding to the width of the terrace portion which is depressed relative to a central portion (i.e., the outer periphery is sagged), thereby preventing bonding at the outer peripheral region and avoiding any trouble arising from local bonds. By the term trouble, it is meant that if grinding variations occur between bonded and unbonded portions of the outer periphery during grinding, the Si substrate can be chipped at its outer periphery by catchings of the grinding wheel at the interface. If such a trouble occurs, the surface is damaged by Si chips spalling off.

Equivalent effects are exerted when the SOI substrate is provided with a terrace portion.

Next, on the surface of silicon active layer 3 of the SOI substrate furnished, a second silicon oxide layer 4 is formed (FIG. 1 (a)). The second silicon oxide layer 4 may be formed by thermal oxidation of the silicon active layer 3. The second silicon oxide layer 4 serves to establish a tight bond between the SOI substrate and the support substrate and preferably has a thickness of 50 to 300 nm. If the thickness is less than 50 nm, moisture confined at the bond interface cannot diffuse, but collects together like a water blister during heat treatment. If the thickness exceeds 300 nm, the silicon active layer 3 prior to oxidation must be made thicker, or the oxidative treatment time is prolonged, adversely affecting the productivity and cost.

(Step 2: Step of Furnishing Support Substrate)

The support substrate is a transparent insulating substrate which becomes a handle substrate of hybrid substrate, and preferably made of quartz glass, borosilicate glass or sapphire. In this case, the support substrate has a different coefficient of thermal expansion from the SOI substrate. Herein, a sapphire substrate 5 is furnished as a typical example (FIG. 1 (b)).

The support substrate (sapphire substrate 5) is preferably of the same outer dimensions as the SOI substrate because it is to be bonded to the SOI substrate. Where the SOI substrate (silicon substrate 1) is provided with an orientation flat (OF) or notch, the support substrate is preferably provided with an identical orientation flat or notch.

Prior to bonding of the SOI substrate and the support substrate, for example, the sapphire substrate 5 may be subjected to heat treatment in a reducing atmosphere. If the sapphire substrate 5 is bonded to the SOI substrate after heat treatment in a reducing atmosphere, the number of defects in the silicon active layer 3 is reduced, and metal impurities are removed from the sapphire substrate 5 to such a level that it may be introduced into the semiconductor manufacture line without cleaning.

Examples of the reducing atmosphere used herein include a reducing gas consisting of a gas selected from among carbon monoxide, hydrogen sulfide, sulfur dioxide, hydrogen and formaldehyde or a combination thereof, and a mixture of the reducing gas and an inert gas. Inter alia, an atmosphere containing at least hydrogen is preferred, i.e., an atmosphere consisting of hydrogen solely or a hydrogen-containing inert gas, with an atmosphere consisting solely of hydrogen being most preferred.

The lower limit of heat treatment temperature is preferably at least 600° C., more preferably at least 700° C. If the heat treatment temperature is lower than 600° C., the effect of removing metals from the surface of the sapphire substrate 5 may be insufficient.

The upper limit of heat treatment temperature is preferably up to 1,100° C., more preferably up to 900° C. If the heat treatment temperature exceeds 1,100° C., the number of defects in the surface of the silicon active layer 3 of the hybrid substrate is rather increased so that the hybrid substrate may become unacceptable.

The heat treatment time is preferably 10 seconds to 12 hours, more preferably 1 minute to 1 hour. If the heat treatment time is shorter than 10 seconds, the effect of removing metals from the surface of the sapphire substrate 5 may be insufficient and the effect of reducing the number of defects in the surface of the silicon active layer 3 of the hybrid substrate may be insufficient. A time of longer than 12 hours may invite an increase in the cost of heat treatment.

(Step 3: Step of Surface Activation Treatment on SOI Substrate and/or Support Substrate)

Prior to bonding, either one or both of the surface of second silicon oxide layer 4 of the SOI substrate and the surface of the sapphire substrate 5 are subjected to surface activation treatment.

The surface activation treatment intends to achieve activation by exposing highly reactive dangling bonds on the substrate surface or imparting OH groups to the dangling bonds, and is carried out, for example, by plasma treatment or ion beam irradiation treatment.

In the case of plasma treatment, for example, the SOI substrate and/or sapphire substrate 5 is placed in a vacuum chamber, and a plasma-creating gas is introduced therein, after which the substrate surface is plasma treated by exposure to a high-frequency plasma at a power of about 100 W for about 5 to 30 seconds. The plasma-creating gas used for the treatment of the SOI substrate may be oxygen gas plasma when the surface is oxidized, and hydrogen gas, argon gas, a mixture thereof, or a mixture of hydrogen and helium gases when the surface is not oxidized. The plasma-creating gas used for the treatment of the sapphire substrate 5 may be hydrogen gas, argon gas, nitrogen gas or a mixture thereof. Through the treatment, organic matter on the surface of the SOI substrate and/or sapphire substrate 5 is oxidized and removed, and more OH groups are available on the surface, whereby the surface is activated.

The treatment by ion beam irradiation is by creating an ion beam of the gas used in plasma treatment, and irradiating the ion beam to the SOI substrate and/or sapphire substrate 5 for sputtering the surface, thereby exposing dangling bonds on the surface to increase bond strength.

(Step 4: Step of Bonding SOI Substrate to Support Substrate)

Next, the SOI substrate and the sapphire substrate 5 are bonded via the second silicon oxide layer 4 at a temperature higher than room temperature (25° C.) (FIG. 1 (c)). The bonded assembly is referred to as bonded substrate, hereinafter. The bonding temperature may be from 100° C. to less than 250° C., preferably from 100° C. to 225° C., and more preferably from 150° C. to 225° C. If the bonding temperature is lower than 100° C., the SOI substrate and the sapphire substrate 5 may not be effectively bonded. If the bonding temperature is equal to or higher than 250° C., delamination of the silicon active layer or failure of the bonded substrate may occur due to the difference in coefficient of thermal expansion between the SOI substrate and the sapphire substrate 5.

(Step 5: Step of Consolidation Heat Treatment)

After the bonding step, the bonded substrate is subjected to heat treatment (consolidation heat treatment) by applying heat. Through this heat treatment, the bond between the SOI substrate and the sapphire substrate 5 is consolidated. The temperature of this heat treatment is preferably a temperature which is higher than the bonding temperature by 0 to 100° C. and at which the bonded substrate does not fail under the influence (thermal stress) of the difference in coefficient of thermal expansion between the SOI substrate and the sapphire substrate 5 (i.e., a temperature of lower than 250° C.). Specifically, the temperature is from 150° C. to lower than 250° C., preferably from 150° C. to 225° C., and more preferably from 150° C. to 200° C. The heat treatment time is, for example, 1 to 24 hours.

(Step 6: Step of Thinning Silicon Substrate by Grinding)

The silicon substrate 1 of the bonded substrate is thinned by grinding (FIG. 1 (d)). The thickness after thinning is preferably 60 μm at the thinnest. If the thickness of thinned silicon substrate 1' is less than 60 μm, delamination of the silicon active layer 3 may occur at the outer periphery of the bonded substrate under the action of local stresses applied to the bonded substrate during grinding work.

For the grinding work, a back-grinder used for wafer processing (e.g., PG200 by Tokyo Seimitsu Co., Ltd.) may be used. Grinding may be followed by polishing to remove the work-damaged surface layer. The grinding tool used may be selected in terms of the volume of material removed and the thickness of work-damaged layer. For thinning the work-damaged layer, grinding may be carried out in two stages with a change of grit size. For example, a grinding tool of #320 to #600 is used in the first stage to ensure a grinding speed until ⅔ to ¾ of the thickness (to be ground) is ground off. Then a grinding tool of #1200 to #2000 is used in the second stage for grinding, leaving a finishing allowance. Finally, polishing is carried out to such an extent as to remove the damage by the second stage grinding or to accomplish mirror finish. The final polishing prevents any failure during the subsequent consolidation heat treatment.

Also, a combination of the consolidation heat treatment (Step 5) of increasing the bond strength between SOI substrate and support substrate and the grinding/thinning treatment (Step 6) of thinning the silicon substrate 1 of the bonded substrate by grinding is repeated at least twice. Preferably the temperature of second heat treatment is higher than the temperature of first heat treatment. Specifically, the following procedure may be employed.

(Step 5-1): The bonded substrate is heated at 150° C. to lower than 200° C. to carry out first consolidation heat treatment. The heat treatment time is 1 to 24 hours.

(Step 6-1): The silicon substrate 1 of the bonded substrate is thinned by grinding (first grinding/thinning treatment). The thickness of the silicon substrate after the first grinding/thinning treatment is preferably 130 to 200 µm, more preferably 130 to 170 µm. In this step, grinding is preferably carried out in two stages (first stage grinding—second stage grinding—polishing) as mentioned above.

(Step 5-2): The bonded substrate is heated at 200° C. to lower than 250° C. to carry out second (or final if the combination of Steps 5 and 6 is repeated three or more times) consolidation heat treatment. The heat treatment time is 1 to 24 hours.

(Step 6-2): The silicon substrate 1 of the bonded substrate is further thinned by grinding (second grinding/thinning treatment). The thickness of the silicon substrate after the second (or final if the combination of Steps 5 and 6 is repeated three or more times) grinding/thinning treatment is preferably 60 to 100 µm, more preferably 60 to 85 µm. With respect to grinding conditions, since work traces or damages, if left, affect the stability of the subsequent etching step, grinding is carried out in two stages as mentioned above, using a grinding tool of at least #600 in the first stage and a grinding tool of at least #2000 in the second stage. In this step, polishing is omitted because of the risk of delamination of silicon substrate 1 at the outer periphery, and it is preferable from this aspect to select a grinding tool of fine grit size.

While the silicon substrate 1 is thinned in successive stages, every thinning stage is followed by consolidation heat treatment at higher temperature to enhance the bond strength between SOI substrate and support substrate. This ensures to prevent the silicon active layer 3 from delamination and the bonded substrate from failure by grinding work.

(Step 7: Step of Removing Thinned Silicon Substrate)

The silicon substrate 1' thinned as mentioned above is etched away until the first silicon oxide layer 2 is exposed (FIG. 1 (e)). Etching is preferably carried out using a mixed acid of electronic grade consisting of nitric acid and hydrofluoric acid or the like as silicon wafer etchant and a spin etching system.

(Step 8: Step of Removing First Silicon Oxide Layer)

The now bare first silicon oxide layer 2 is etched with a hydrofluoric acid aqueous solution until the silicon active layer 3 is exposed (FIG. 1 (f)). The thickness distribution of the silicon active layer 3 is equal to the thickness distribution of the original SOI substrate, and thus comparable to that achieved by the ion implantation/peeling method. The SOI substrate used is provided with an outer peripheral portion, referred to as terrace portion, of 1 to 3 mm wide where no active layer is present, thereby preventing Si islands from forming as a result of extra bond at the periphery during formation of the bonded substrate, so that a hybrid substrate of better quality is obtainable. Furthermore, the SOI substrate used is prepared such that a silicon active layer is defect-free (or COP-free) and no oxidation-induced stacking faults (OSF) form upon thermal oxidation, a silicon thin film of quality unachievable by the ion implantation/peeling method is obtainable.

Finally, the silicon active layer 3 is finish polished to the desired thickness and cleaned, yielding a multilayer film composite substrate (hybrid substrate) of SOI structure having the silicon active layer 3 on the support substrate (sapphire substrate 5) (FIG. 1 (g)).

EXAMPLES

Experiments are given below for illustrating the invention although the invention is not limited thereto.

Experiment 1

A hybrid substrate was produced by carrying out Steps 1 to 8 of the hybrid substrate producing method under the conditions described below.

(Step 1): A substrate having a diameter 150 mm, thickness 525 µm, and OF 47.5 mm was furnished as a SOI substrate. The thicknesses of silicon active layer 3 and other layers are set such that the second silicon oxide layer 4 ($SiO_2$): 200 nm/silicon active layer 3: 380 nm/first silicon oxide layer 2 ($SiO_2$): 300 nm in the order from the surface layer (FIG. 1 (a)), though the thicknesses vary depending on a particular device to be fabricated. It is noted that the second silicon oxide layer 4 is an oxide film obtained by thermal oxidation of the silicon active layer of the SOI substrate, and the first silicon oxide layer 2 is a buried oxide (BOX) film of the SOI substrate. A terrace portion of 2 mm wide was formed at the periphery of the SOI substrate.

(Step 2): A sapphire substrate 5 made of sapphire and having a diameter 150 mm, thickness 600 µm, and OF 47.5 mm was furnished as a support substrate.

(Step 3): The surfaces of the SOI substrate and the sapphire substrate 5 to be bonded were subjected to activation treatment by irradiating a plasma of 100 W in a nitrogen atmosphere of reduced pressure.

(Step 4): The SOI substrate was bonded to the sapphire substrate 5 at room temperature (25° C.).

Next, a combination of consolidation heat treatment (Step 5) of increasing the bond strength between the SOI substrate and the support substrate and grinding/thinning treatment (Step 6) of thinning the silicon substrate 1 of the bonded substrate by grinding was repeated twice.

(Step 5-1): The bonded substrate was subjected to consolidation heat treatment at 150° C. for 24 hours. As a result, the outer appearance of the bonded substrate was free of anomalies such as peels and satisfactory.

(Step 6-1): The silicon substrate 1 of the bonded substrate was ground to a thickness of 150 µm. The grinding conditions were selected such that first stage of grinding reached a thickness of 180 µm, second stage of grinding approximated a thickness of 150 µm, and final polishing finished to 150 µm. As a result, the outer appearance was satisfactory.

It is noted that in the Experiments described later, first grinding (Step 6-1) followed the sequence of first stage of grinding—second stage of grinding—finish polishing.

Herein, trimming of the outer periphery of the bonded substrate was omitted.

(Step 5-2): The bonded substrate was subjected to consolidation heat treatment at 150° C. for 24 hours. As a result, the outer appearance of the bonded substrate was free of anomalies such as peels and satisfactory.

(Step 6-2): The silicon substrate 1 of the bonded substrate was ground to a thickness of 50 μm. The grinding conditions were selected such that first stage of grinding reduced the thickness of silicon substrate 1 to 100 μm, and second stage of grinding finished to a thickness of 50 μm.

As a result, it was found that the silicon substrate 1 peeled from the junction at the outer periphery of the bonded substrate.

It is noted that in the Experiments described later, second grinding (Step 6-2) followed the sequence of first stage of grinding—second stage of grinding.

(Step 7): The thinned silicon substrate 1' was removed by spin etching with a mixed acid of electronic grade (mirror finish etchant Si Etch E by Nippon Kasei Chemical Co., Ltd.).

Figure 2:
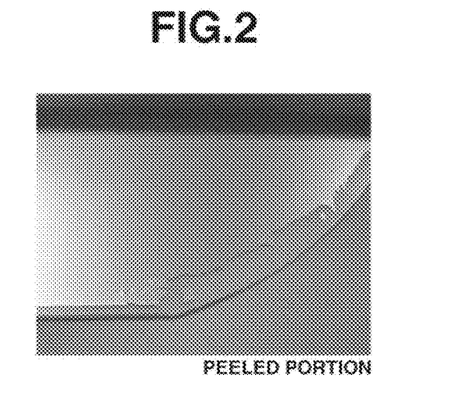
FIG. 2 is an external view showing the silicon active layer which peels off at the periphery of sapphire substrate in Experiment 1.

(Step 8): Finally, the exposed first silicon oxide layer 2 was etched away with a hydrofluoric acid aqueous solution until the silicon active layer 3 was exposed. As a result, peels were found in the outer periphery of the silicon active layer 3 as shown in FIG. 2.

Experiment 2

A hybrid substrate was prepared as in Experiment 1 except that the second grinding (Step 6-2) was omitted. As a result, peels were found in the outer periphery of the silicon active layer 3.

Experiment 3

In Experiment 1, the heat treatment temperature during the second consolidation heat treatment (Step 5-2) was changed to 175° C. It was found that the silicon substrate 1 peeled from the junction in the outer periphery of the bonded substrate. The subsequent treatments were no longer continued.

Experiment 4

In Experiment 1, the heat treatment temperature during the first consolidation heat treatment (Step 5-1) was changed to 175° C. It was found that the silicon substrate 1 peeled from the junction in the outer periphery of the bonded substrate. The subsequent treatments were no longer continued.

Experiment 5

In Experiment 1, treatments following peripheral trimming were carried out under different conditions as described below.

The periphery of the bonded substrate was trimmed only 1 mm.

(Step 5-2): The bonded substrate was subjected to consolidation heat treatment at 170° C. for 24 hours. As a result, the outer appearance of the bonded substrate was free of anomalies such as peels and satisfactory.

(Step 6-2): The silicon substrate 1 of the bonded substrate was ground to a thickness of 50 μm. As a result, the outer appearance of the bonded substrate was satisfactory.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, the outer appearance of the silicon active layer 3 was satisfactory.

Next, the silicon active layer 3 was thinned by polishing to a thickness of 280 nm, yielding a hybrid substrate of SOI structure.

Experiment 6

In Experiment 1, treatments following peripheral trimming were carried out under different conditions as described below.

The periphery of the bonded substrate was trimmed only 1 mm.

(Step 5-2): The bonded substrate was subjected to consolidation heat treatment at 175° C. for 24 hours. As a result, substrate peels were found in the bonded substrate.

(Step 6-2): The silicon substrate 1 of the bonded substrate was ground to a thickness of 50 μm. As a result, it was found that the silicon substrate 1 peeled from the junction in the outer periphery of the bonded substrate.

(Step 7): The thinned silicon substrate 1' was removed by spin etching with a mixed acid of electronic grade (mirror finish etchant Si Etch E by Nippon Kasei Chemical Co., Ltd.).

Figure 3:
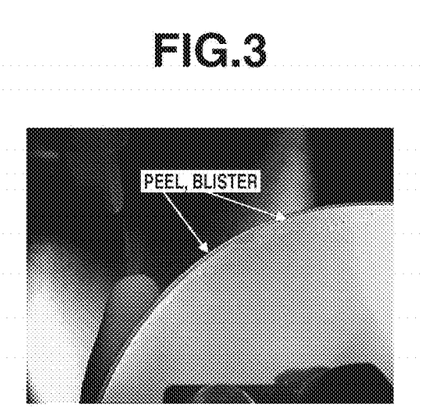
FIG. 3 is an external view showing the silicon active layer which peels off and floats at the periphery of sapphire substrate in Experiment 6.

(Step 8): Finally, the exposed first silicon oxide layer 2 was etched away with a hydrofluoric acid aqueous solution until the silicon active layer 3 was exposed. As a result, peels and blisters were found in the outer periphery of the silicon active layer 3 as shown in FIG. 3.

Experiment 7

In Experiment 1, treatments following bonding step (Step 4) were carried out under different conditions as described below.

(Step 4): The SOI substrate was abutted and bonded to the sapphire substrate 5 while heating at 100° C.

Next, a combination of the consolidation heat treatment (Step 5) of increasing the bond strength between the SOI substrate and the support substrate and the grinding/thinning treatment (Step 6) of thinning the silicon substrate 1 of the bonded substrate by grinding was repeated twice.

(Step 5-1): The bonded substrate was subjected to consolidation heat treatment at 150° C. for 24 hours. As a result, the outer appearance of the bonded substrate was free of anomalies such as peels and satisfactory.

(Step 6-1): The silicon substrate 1 of the bonded substrate was ground to a thickness of 150 μm. As a result, the outer appearance was satisfactory.

Trimming of the outer periphery of the bonded substrate was omitted.

(Step 5-2): The bonded substrate was subjected to consolidation heat treatment at 175° C. for 24 hours. As a result, the outer appearance of the bonded substrate was free of anomalies such as peels and satisfactory.

(Step 6-2): The silicon substrate 1 of the bonded substrate was ground to a thickness of 50 μm. As a result, it was found that the silicon substrate 1 peeled from the junction at the outer periphery of the bonded substrate.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, peels were found in the outer periphery of the silicon active layer 3. It is presumed that the grinding wheel is catching as it rotates during the grinding step, whereby stresses act to peel off the silicon substrate 1.

Experiment 8

Experiment 7 was followed while the temperature of consolidation heat treatment (Step 5-2) was changed to 200° C., and in the second grinding treatment (Step 6-2), the silicon substrate 1 of the bonded substrate was ground to a thickness of 80 μm. As a result, the outer appearance of the bonded substrate was free of anomalies such as peels and satisfactory. Next, in Steps 7 and 8, etching was carried out as in Experiment 7 until the silicon active layer 3 was exposed. As a result, the outer appearance of the silicon active layer 3 was satisfactory. Finally, the silicon active layer 3 was thinned by polishing to a thickness of 280 nm, yielding a hybrid substrate of SOI structure.

Experiment 9

In Experiment 1, treatments following the bonding step (Step 4) were carried out under different conditions as described below.

(Step 4): The SOI substrate was abutted and bonded to the sapphire substrate 5 while heating at 120° C.

Next, a combination of the consolidation heat treatment (Step 5) of increasing the bond strength between the SOI substrate and the support substrate and the grinding/thinning treatment (Step 6) of thinning the silicon substrate 1 of the bonded substrate by grinding was repeated twice.

(Step 5-1): The bonded substrate was subjected to consolidation heat treatment at 150° C. for 24 hours. As a result, the outer appearance of the bonded substrate was free of anomalies such as peels and satisfactory.

(Step 6-1): The silicon substrate 1 of the bonded substrate was ground to a thickness of 150 μm. As a result, the outer appearance was satisfactory.

Trimming of the outer periphery of the bonded substrate was omitted.

(Step 5-2): The bonded substrate was subjected to consolidation heat treatment at 200° C. for 24 hours. As a result, the outer appearance of the bonded substrate was free of anomalies such as peels and satisfactory.

(Step 6-2): The silicon substrate 1 of the bonded substrate was ground to a thickness of 80 μm. As a result, the outer appearance of the bonded substrate was satisfactory.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, the outer appearance of the silicon active layer 3 was satisfactory.

Next, the silicon active layer 3 was thinned by polishing to a thickness of 280 nm, yielding a hybrid substrate of SOI structure.

Experiment 10

In Experiment 1, treatments following the bonding step (Step 4) were carried out under different conditions as described below.

(Step 4): The SOI substrate was abutted and bonded to the sapphire substrate 5 while heating at 150° C.

Next, a combination of the consolidation heat treatment (Step 5) of increasing the bond strength between the SOI substrate and the support substrate and the grinding/thinning treatment (Step 6) of thinning the silicon substrate 1 of the bonded substrate by grinding was repeated twice.

(Step 5-1): The bonded substrate was subjected to consolidation heat treatment at 175° C. for 24 hours. As a result, the outer appearance of the bonded substrate was free of anomalies such as peels and satisfactory.

(Step 6-1): The silicon substrate 1 of the bonded substrate was ground to a thickness of 120 μm. As a result, it was found that the silicon substrate 1 peeled from the junction at the outer periphery of the bonded substrate.

Trimming of the outer periphery of the bonded substrate was omitted.

(Step 5-2): The bonded substrate was subjected to consolidation heat treatment at 200° C. for 24 hours. As a result, the outer appearance of the bonded substrate was free of anomalies such as peels and satisfactory.

(Step 6-2): The silicon substrate 1 of the bonded substrate was ground to a thickness of 80 μm. As a result, it was found that the silicon substrate 1 peeled from the junction at the outer periphery of the bonded substrate.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, peels were found in the outer periphery of the silicon active layer 3. It is presumed that the grinding wheel is catching as it rotates during the grinding step, whereby stresses act to peel off the silicon substrate 1.

Experiment 11

In Experiment 10, treatments following Step 6-1 were carried out under different conditions as described below.

(Step 6-1): The silicon substrate 1 of the bonded substrate was ground to a thickness of 150 μm. As a result, the outer appearance was satisfactory.

Trimming of the outer periphery of the bonded substrate was omitted.

(Step 5-2): The bonded substrate was subjected to consolidation heat treatment at 200° C. for 24 hours. As a result, the outer appearance of the bonded substrate was free of anomalies such as peels and satisfactory.

(Step 6-2): The silicon substrate 1 of the bonded substrate was ground to a thickness of 60 μm. As a result, the outer appearance of the bonded substrate was satisfactory.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, the outer appearance of the silicon active layer 3 was satisfactory.

Next, the silicon active layer 3 was thinned by polishing to a thickness of 280 nm, yielding a hybrid substrate of SOI structure.

Experiment 12

In Experiment 10, treatments following Step 6-1 were carried out under different conditions as described below.

(Step 6-1): The silicon substrate 1 of the bonded substrate was ground to a thickness of 200 µm. As a result, the outer appearance was satisfactory.

Trimming of the outer periphery of the bonded substrate was omitted.

(Step 5-2): The bonded substrate was subjected to consolidation heat treatment at 200° C. for 24 hours. As a result, the outer appearance of the bonded substrate was free of anomalies such as peels and satisfactory.

(Step 6-2): The silicon substrate 1 of the bonded substrate was ground to a thickness of 75 µm. As a result, the outer appearance of the bonded substrate was satisfactory.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, the outer appearance of the silicon active layer 3 was satisfactory.

Next, the silicon active layer 3 was thinned by polishing to a thickness of 280 nm, yielding a hybrid substrate of SOI structure.

Experiment 13

In Experiment 1, treatments following the bonding step (Step 4) were carried out under different conditions as described below.

(Step 4): The SOI substrate was abutted and bonded to the sapphire substrate 5 while heating at 175° C.

Next, a combination of the consolidation heat treatment (Step 5) of increasing the bond strength between the SOI substrate and the support substrate and the grinding/thinning treatment (Step 6) of thinning the silicon substrate 1 of the bonded substrate by grinding was repeated twice.

(Step 5-1): The bonded substrate was subjected to consolidation heat treatment at 175° C. for 24 hours. As a result, the outer appearance of the bonded substrate was free of anomalies such as peels and satisfactory.

(Step 6-1): The silicon substrate 1 of the bonded substrate was ground to a thickness of 150 µm. As a result, the outer appearance was satisfactory.

Trimming of the outer periphery of the bonded substrate was omitted.

(Step 5-2): The bonded substrate was subjected to consolidation heat treatment at 200° C. for 24 hours. As a result, the outer appearance of the bonded substrate was free of anomalies such as peels and satisfactory.

(Step 6-2): The silicon substrate 1 of the bonded substrate was ground to a thickness of 50 µm. As a result, some bonded substrates had a satisfactory outer appearance, while in the remaining bonded substrates, the silicon substrate 1 peeled from the junction at the outer periphery.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, the silicon active layer 3 corresponding to those bonded substrates having a satisfactory outer appearance after the grinding treatment, had a satisfactory outer appearance. On the other hand, the silicon active layer 3 corresponding to those bonded substrates suffering peripheral peels after the grinding treatment, showed peels at the outer periphery. It is presumed that when peels are found in the outer periphery, the grinding wheel is catching as it rotates during the grinding step, whereby stresses act to peel off the silicon substrate 1.

For those samples having satisfactory silicon active layer 3, the silicon active layer 3 was thinned by polishing to a thickness of 280 nm, yielding a hybrid substrate of SOI structure.

From the results of Experiment 13, the silicon substrate thinned to 50 µm is not regarded stable (because of a strong possibility of delamination by catching at blisters on the outer periphery during grinding). After grinding, a thickness of greater than 50 µm, preferably at least 60 µm should be left.

Experiment 14

In the second grinding treatment (Step 6-2) of Experiment 13, the silicon substrate 1 of the bonded substrate was ground to a thickness of 75 µm. As a result, the outer appearance of the bonded substrate was free of anomalies such as peels and satisfactory. Next, in Steps 7 and 8, etching was carried out as in Experiment 13 until the silicon active layer 3 was exposed. As a result, the silicon active layer 3 had a satisfactory outer appearance. Finally, the silicon active layer 3 was thinned by polishing to a thickness of 280 nm, yielding a hybrid substrate of SOI structure.

Experiment 15

In the second grinding treatment (Step 6-2) of Experiment 13, the silicon substrate 1 of the bonded substrate was ground to a thickness of 85 µm. As a result, the outer appearance of the bonded substrate was free of anomalies such as peels and satisfactory. Next, in Steps 7 and 8, etching was carried out as in Experiment 13 until the silicon active layer 3 was exposed. As a result, the silicon active layer 3 had a satisfactory outer appearance. Finally, the silicon active layer 3 was thinned by polishing to a thickness of 280 nm, yielding a hybrid substrate of SOI structure.

Experiment 16

Except that the periphery of the bonded substrate was trimmed only 1 mm, the procedure of Experiment 13 was followed until the second grinding treatment (Step 6-2). The outer appearance of the bonded substrate was free of anomalies such as peels and satisfactory. Next, in Steps 7 and 8, etching was carried out as in Experiment 13 until the silicon active layer 3 was exposed. As a result, the silicon active layer 3 had a satisfactory outer appearance. Finally, the silicon active layer 3 was thinned by polishing to a thickness of 280 nm, yielding a hybrid substrate of SOI structure.

The trimming step is advantageous in that no peels occur at the periphery of silicon active layer 3. Even when the trimming step is omitted, no peels occur at the substrate periphery as long as the consolidation heat treatment temperature is elevated to enhance the bond strength of the bonded substrate and grinding treatment is carried out to an appropriate extent as in Experiments 14 and 15.

Experiment 17

In Experiment 1, treatments following the bonding step (Step 4) were carried out under different conditions as described below.

(Step 4): The SOI substrate was abutted and bonded to the sapphire substrate 5 while heating at 225° C.

Next, a combination of the consolidation heat treatment (Step 5) of increasing the bond strength between the SOI substrate and the support substrate and the grinding/thinning treatment (Step 6) of thinning the silicon substrate 1 of the bonded substrate by grinding was repeated twice. In this Experiment, the second consolidation heat treatment was omitted.

(Step 5-1): The bonded substrate was subjected to consolidation heat treatment at 225° C. for 24 hours. As a result, the outer appearance of the bonded substrate was free of anomalies such as peels and satisfactory. Notably, the bonded substrate warped to such an extent that subsequent grinding treatment was difficult, but still possible.

(Step 6-1): The silicon substrate 1 of the bonded substrate was ground to a thickness of 150 μm. As a result, the outer appearance was satisfactory.

Trimming of the outer periphery of the bonded substrate was omitted.

(Step 5-2): Since it was confirmed that a tight bond was established between the SOI substrate and the sapphire substrate 5 by the first consolidation heat treatment, the second consolidation heat treatment was omitted.

(Step 6-2): The silicon substrate 1 of the bonded substrate was ground to a thickness of 50 μm. As a result, the outer appearance was satisfactory.

(Step 7): The thinned silicon substrate 1' was removed by spin etching with a mixed acid of electronic grade (mirror finish etchant Si Etch E by Nippon Kasei Chemical Co., Ltd.).

(Step 8): Finally, the exposed first silicon oxide layer 2 was etched away with a hydrofluoric acid aqueous solution until the silicon active layer 3 was exposed. As a result, the outer appearance of the silicon active layer 3 was satisfactory.

Finally, the silicon active layer 3 was thinned by polishing to a thickness of 280 nm, yielding a hybrid substrate of SOI structure.

The foregoing results are tabulated in Table 1.

TABLE 1

| | | Step 4 Bonding Bonding temp. (° C.) | Step 5-1 Consolidation heat treatment (1) | | Step 6-1 Grinding (1) | | Periphery trimming Yes/No | Step 5-2 Consolidation heat treatment (2) | | Step 6-2 Grinding (2) | | Steps 7, 8 | |
|---|---|---|---|---|---|---|---|---|---|---|---|---|---|
| | | | Temp. (° C.) | Appearance after heat treatment | Substrate thickness *1 (μm) | Appearance after grinding | | Temp. (° C.) | Appearance after heat treatment | Substrate thickness *1 (μm) | Appearance after grinding | Etching Appearance after etching | Remarks |
| Experiment | 1 | RT (25) | 150 | satisfactory | 150 | satisfactory | No | 150 | satisfactory | 50 | peripheral peel | periphery NG *2 | FIG. 2 |
| | 2 | RT (25) | 150 | satisfactory | 150 | satisfactory | No | 150 | satisfactory | no second grinding | | periphery NG *2 | |
| | 3 | RT (25) | 150 | satisfactory | 150 | satisfactory | No | 175 | substrate peel | — | — | — | |
| | 4 | RT (25) | 175 | substrate peel | — | — | — | — | — | — | — | — | |
| | 5 | RT (25) | 150 | satisfactory | 150 | satisfactory | Yes | 170 | satisfactory | 50 | satisfactory | satisfactory | |
| | 6 | RT (25) | 150 | satisfactory | 150 | satisfactory | Yes | 175 | substrate peel | 50 | peripheral peel | periphery NG *2 | FIG. 3 |
| | 7 | 100 | 150 | satisfactory | 150 | satisfactory | No | 175 | satisfactory | 50 | peripheral peel | periphery NG *2 | |
| | 8 | 100 | 150 | satisfactory | 150 | satisfactory | No | 200 | satisfactory | 80 | satisfactory | satisfactory | |
| | 9 | 125 | 150 | satisfactory | 150 | satisfactory | No | 200 | satisfactory | 80 | satisfactory | satisfactory | |
| | 10 | 150 | 175 | satisfactory | 120 | peripheral peel | No | 200 | satisfactory | 80 | peripheral peel | periphery NG *2 | |
| | 11 | 150 | 175 | satisfactory | 150 | satisfactory | No | 200 | satisfactory | 60 | satisfactory | satisfactory | |
| | 12 | 150 | 175 | satisfactory | 200 | satisfactory | No | 200 | satisfactory | 75 | satisfactory | satisfactory | |
| | 13 | 175 | 175 | satisfactory | 150 | satisfactory | No | 200 | satisfactory | 50 | satisfactory | satisfactory | |
| | | | | | | | | | | 50 | peripheral peel | periphery NG *2 | *3 |
| | 14 | 175 | 175 | satisfactory | 150 | satisfactory | No | 200 | satisfactory | 75 | satisfactory | satisfactory | |
| | 15 | 175 | 175 | satisfactory | 150 | satisfactory | No | 200 | satisfactory | 85 | satisfactory | satisfactory | |
| | 16 | 175 | 175 | satisfactory | 150 | satisfactory | Yes | 200 | satisfactory | 50 | satisfactory | satisfactory | |
| | 17 | 225 | 225 | satisfactory | 150 | satisfactory | No | second heat treatment omitted | | 50 | satisfactory | satisfactory | *4 |

Figure 4:
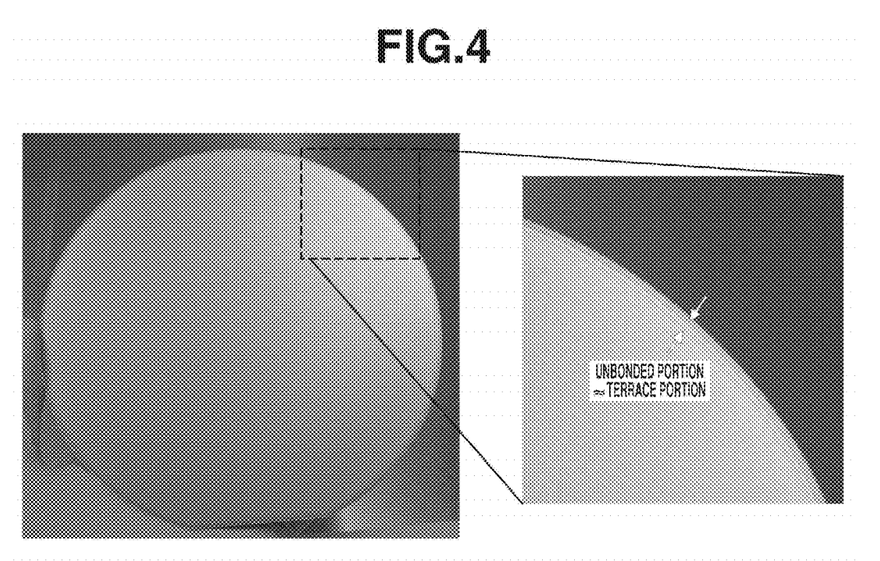
FIG. 4 is an external view showing an example wherein island-like silicon portions are absent at the periphery of sapphire substrate.

*1 thickness of silicon substrate after grinding
*2 peels and blisters at periphery of silicon active layer
*3 catching of grinding wheel during second grinding
*4 substrate warps too much to further work It is noted that when an SOI substrate is not provided with a terrace portion (where a silicon active layer is absent), even under the conditions of Experiment 14, for example, the outer periphery of the bonded substrate includes a bonded portion and a peeled portion due to weak bond strength, and finally, the bonded portion is left in an island pattern. That is, local bonded portions are finally left as islands of silicon in the hybrid substrate, and the island-like silicon portions will spall off in the subsequent step, becoming a fault to lower manufacture yield. To prevent such fault, an outer peripheral region of predetermined width of the surface of a support substrate (sapphire substrate 5) to be bonded to a SOI substrate is preferably thinned and depressed relative to a central portion, so that the substrates are not bonded in the relevant region. Further, when an SOI substrate is provided with a terrace portion, the terrace portion of the SOI substrate and the unbonded portion (i.e., the portion of reduced thickness) of the sapphire substrate 5 are of the same width, and as a result, no island-like silicon portions are formed as shown in FIG. 4. This ensures to prevent any fault from generating at the periphery of the bonded substrate.

Also, as seen from Experiment 17, when the temperature of first consolidation heat treatment is in the range from 200° C. to less than 250° C., a tight bond is established between SOI substrate and support substrate solely by that consolidation heat treatment, allowing the second consolidation heat treatment to be omitted. In this case, when the combination of Steps 5 and 6 (consolidation heat treatment and grinding) is repeated three or more times, the second and subsequent consolidation heat treatments may be omitted.

While the invention has been illustrated and described in typical embodiments, it is not intended to be limited to the details shown. Various other embodiments, additions, modifications and deletions may occur to persons skilled in the art. All such embodiments fall within the spirit and scope of the invention as long as the effects and benefits of the invention are achieved.

REFERENCE SIGNS LIST

1, 1' silicon substrate
2 first silicon oxide layer (BOX layer)
3 silicon active layer
4 second silicon oxide layer
5 sapphire substrate (support substrate)

The invention claimed is:

1. A method for producing a hybrid substrate comprising the steps of:
   furnishing an SOI substrate which is obtained by stacking a first silicon oxide layer and a silicon active layer in this order on a silicon substrate such that a terrace portion not including the silicon active layer is left on an outer peripheral portion of the silicon substrate surface,
   forming a second silicon oxide layer on the silicon active layer surface of the SOI substrate,
   bonding the SOI substrate to a support substrate having a different coefficient of thermal expansion from the SOI substrate, wherein the bonding is performed at a temperature of 100° C. to less than 250° C., with the second silicon oxide layer interposed therebetween, to form a bonded substrate, wherein the terrace portion of the SOI substrate and the support substrate are not directly contacted with each other,
   subjecting the bonded substrate to a combination of a consolidation heat treatment for increasing the bond strength between the SOI substrate and the support substrate and a grinding/thinning treatment of thinning the whole silicon substrate by grinding, the combination being repeated at least twice under the conditions that the temperature of a first consolidation heat treatment is equal to or higher than the bonding temperature, the silicon substrate after a first grinding/thinning treatment has a thickness of 130 μm at the thinnest, the temperature of a final consolidation heat treatment is 200° C. to less than 250° C., the silicon substrate after a final grinding/thinning treatment has a thickness of 60 μm at the thinnest,
   etching away the thinned silicon substrate until the first silicon oxide layer is exposed, and
   etching away the bare first silicon oxide film, yielding a hybrid substrate in which the silicon active layer is disposed on the support substrate via the silicon oxide layer,
   wherein in the combination of the consolidation heat treatment and the grinding/thinning treatment, the consolidation heat treatment and the grinding/thinning treatment are conducted in this order.

2. The method for producing a hybrid substrate of claim 1, wherein the consolidation heat treatment for increasing the bond strength between the SOI substrate and the support substrate is at a temperature which is higher than the bonding temperature by 0 to 100° C. and which is lower than 250° C.

3. The method for producing a hybrid substrate of claim 1, wherein the temperature of second or subsequent consolidation heat treatment is higher than the temperature of the preceding consolidation heat treatment.

4. The method for producing a hybrid substrate of claim 1, wherein the silicon substrate after the first grinding/thinning treatment has a thickness of 130 μm to 200 μm.

5. The method for producing a hybrid substrate of claim 1, wherein the silicon substrate after the final grinding/thinning treatment has a thickness of 60 μm to 100 μm.

6. The method for producing a hybrid substrate of claim 1, wherein the terrace portion has a width of 1 mm to 3 mm.

7. The method for producing a hybrid substrate of claim 1, wherein the support substrate is made of quartz glass, borosilicate glass or sapphire.

8. The method for producing a hybrid substrate of claim 1, further comprising the step of subjecting the support substrate to heat treatment in a reducing atmosphere, prior to the step of bonding the SOI substrate to the support substrate.

9. The method for producing a hybrid substrate of claim 1 wherein the support substrate is thinned such that the surface of the support substrate to be bonded to the SOI substrate includes an outer peripheral region of the same width as the terrace portion of the SOI, which is depressed relative to a central portion.

* * * * *